(12) United States Patent
Eshel et al.

(10) Patent No.: US 10,026,497 B2
(45) Date of Patent: *Jul. 17, 2018

(54) CHARGE INJECTION NOISE REDUCTION IN SAMPLE-AND-HOLD CIRCUIT

(71) Applicant: Sony Semiconductor Solutions Corporation, Kanagawa (JP)

(72) Inventors: Noam Eshel, Pardesia (IL); Golan Zeituni, Kfar-Saba (IL); Zvika Lupu, Haifa (IL)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/644,277

(22) Filed: Jul. 7, 2017

(65) Prior Publication Data

US 2017/0323686 A1 Nov. 9, 2017

Related U.S. Application Data

(63) Continuation of application No. 14/928,524, filed on Oct. 30, 2015, now Pat. No. 9,728,271.

(51) Int. Cl.
*G11C 27/02* (2006.01)
(52) U.S. Cl.
CPC ................................... *G11C 27/02* (2013.01)
(58) Field of Classification Search
CPC ...... G11C 27/02; G11C 27/024; G11C 27/026

USPC .............................................. 327/91, 94, 95
See application file for complete search history.

(56) References Cited

U.S. PATENT DOCUMENTS

| | | | | |
|---|---|---|---|---|
| 5,783,952 A * | 7/1998 | Kazazian | ............ | G11C 27/028 327/91 |
| 7,843,442 B2 * | 11/2010 | Choi | .................... | G09G 3/3233 327/94 |
| 2004/0263051 A1 | 12/2004 | Yamashita | | |
| 2004/0263057 A1 * | 12/2004 | Uchino | ................ | G09G 3/3233 313/500 |
| 2004/0263501 A1 * | 12/2004 | Yamashita | ........... | G09G 3/3233 345/204 |

* cited by examiner

*Primary Examiner* — William Hernandez
(74) *Attorney, Agent, or Firm* — Michael Best & Friedrich LLP

(57) ABSTRACT

A sample-and-hold circuit includes a first transistor; a second transistor disposed between a gate electrode and a drain electrode of the first transistor; a sampling capacitor, an electrode of the sampling capacitor being connected to the gate electrode of the first transistor; and a first current source connected to the drain electrode of the first transistor, where a gate electrode of the second transistor receives a gate control signal. A minimum voltage of the gate control signal is $V_{th2}+V_{sat2}+V_{th1}+V_{sat1}$, where $V_{th1}$ is a threshold voltage of the first transistor, $V_{sat1}$ is a saturation voltage of the first transistor, $V_{th2}$ is a threshold voltage of the second transistor, and $V_{sat2}$ is a saturation voltage of the second transistor.

14 Claims, 4 Drawing Sheets

CHARGE INJECTION NOISE REDUCTION IN SAMPLE-AND-HOLD CIRCUIT

CROSS REFERENCES TO RELATED APPLICATIONS

The present application is a Continuation of application Ser. No. 14/928,524, filed Oct. 30, 2015. The entire contents of these applications are incorporated herein by reference.

BACKGROUND OF THE INVENTION

1. Field of the Invention

This application relates generally to sample-and-hold circuits. More specifically, this application relates to a sample-and-hold circuit that can reduce the effects of noise in image sensing or other electronic applications.

2. Description of Related Art

Image sensing devices typically consist of an image sensor, generally an array of pixel circuits, as well as signal processing circuitry and any associated control or timing circuitry. Within the image sensor itself, charge is collected in a photoelectric conversion device of the pixel circuit as a result of the impingement of light.

One example of a pixel circuit is illustrated in FIG. 1. As shown in FIG. 1, a pixel circuit 100 includes a photoelectric conversion device 101 (for example, a photodiode), a floating diffusion FD, a transfer transistor 102, a reset transistor 103, an amplification transistor 104, and a selection transistor 105, and a vertical signal line 106. As illustrated, vertical signal line 106 is common to a plurality of pixel circuits within the same column. Alternatively, a vertical signal line may be shared among multiple columns. Gate electrodes of transfer transistor 102, reset transistor 103, and selection transistor 105 receive signals TRG, RST, and SEL, respectively. These signals may, for example, be provided by the control or timing circuitry.

While FIG. 1 illustrates a pixel circuit having four transistors in a particular configuration, the current disclosure is not so limited and may apply to a pixel circuit having fewer or more transistors as well as other elements, such as capacitors, resistors, and the like. Additionally, the current disclosure may be extended to configurations where one or more transistors are shared among multiple photoelectric conversion devices.

The accumulated charge is then converted to a digital value. Such a conversion typically requires several circuit components such as sample-and-hold (S/H) circuits, analog-to-digital converters (ADC), and timing and control circuits, with each circuit component serving a purpose in the conversion. For example, the purpose of the S/H circuit may be to sample the analog signals from different time phases of the photo diode operation, after which the analog signals may be converted to digital form by the ADC.

However, typical sample-and-hold circuit implementations may contain various stray capacitances and stray charge, which may result in inaccuracies in the output of the sample-and-hold circuit. This is undesirable in applications where a high precision of the sample-and-hold is required. Therefore, there exists a need for a method of signal processing that can reduce the impact of noise as a result of stray capacitances and stray charges.

BRIEF SUMMARY OF THE INVENTION

Various aspects of the present disclosure relate to a sample-and-hold circuit and a gate control circuit for applying a gate control signal to a gate electrode within the sample-and-hold circuit.

In one aspect of the present disclosure, a sample-and-hold circuit includes a first transistor; a second transistor disposed between a gate electrode and a drain electrode of the first transistor; a sampling capacitor, an electrode of the sampling capacitor being connected to the gate electrode of the first transistor; and a first current source connected to the drain electrode of the first transistor, wherein a gate electrode of the second transistor is configured to receive a gate control signal.

In another aspect of the present disclosure, a gate control circuit, comprises a first transistor; a second transistor connected to the first transistor in series; a first current source; and an inverter configured to receive a supply voltage and an inverter control signal and output a gate control signal.

In the above aspects of the present disclosure, a minimum voltage of the gate control signal is $V_{th2}+V_{sat2}+V_{th1}+V_{sat1}$, wherein $V_{th1}$ is a threshold voltage of the first transistor, $V_{sat1}$ is a saturation voltage of the first transistor, $V_{th2}$ is a threshold voltage of the second transistor, and $V_{sat2}$ is a saturation voltage of the second transistor.

In this manner, the above aspects of the present disclosure provide for improvements in at least the technical field of signal processing, as well as the related technical field of imaging.

This disclosure can be embodied in various forms, including business processes, computer-implemented methods, computer program products, computer systems and networks, user interfaces, application programming interfaces, hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as flowcharts, data tables, and system configurations. It will be readily apparent to one skilled in the art that these specific details are merely exemplary and not intended to limit the scope of this application.

Moreover, while the present disclosure focuses mainly on examples in which the S/H circuits are used in image sensors, it will be understood that this is merely one example of an implementation. It will further be understood that the disclosed S/H circuits can be used in any device in which there is a need to sample a signal and/or compare two voltages; for example, an audio signal processing circuit, industrial measurement and control circuit, and so on.

In this manner, the present disclosure provides for improvements in the technical field of signal processing, as well as in the related technical fields of image sensing and image processing.

[Sample-and-Hold Circuit]

Figure 1:
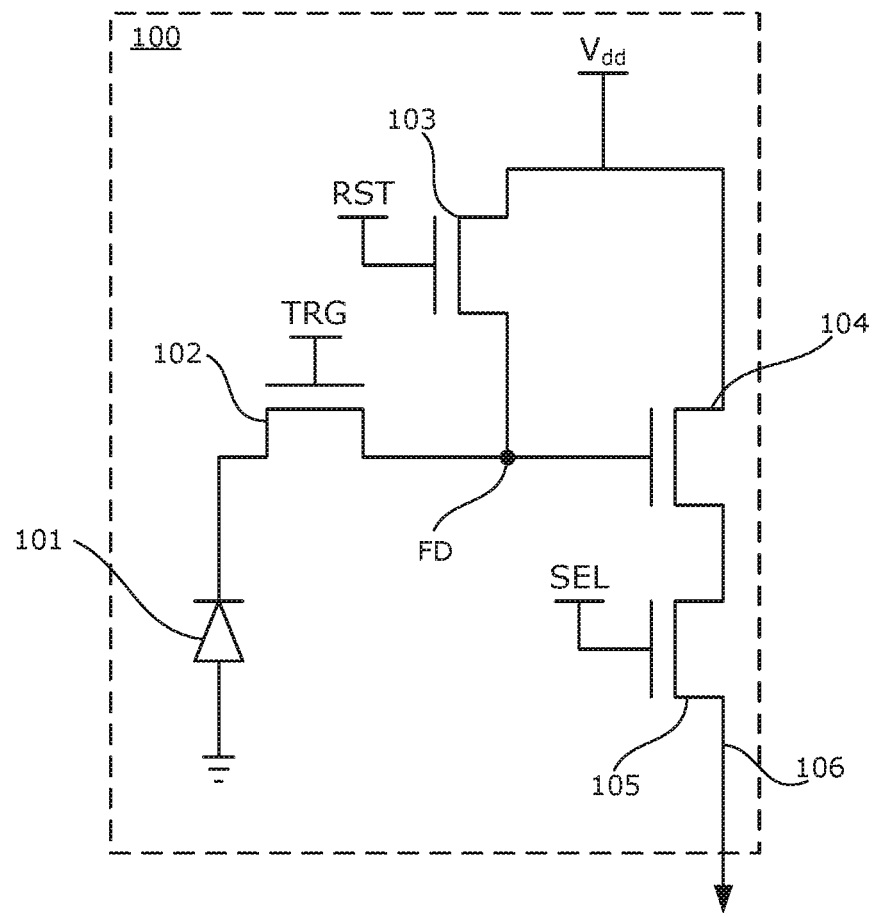
FIG. 1 illustrates an exemplary pixel circuit for use with various aspects of the present disclosure.
Figure 2:
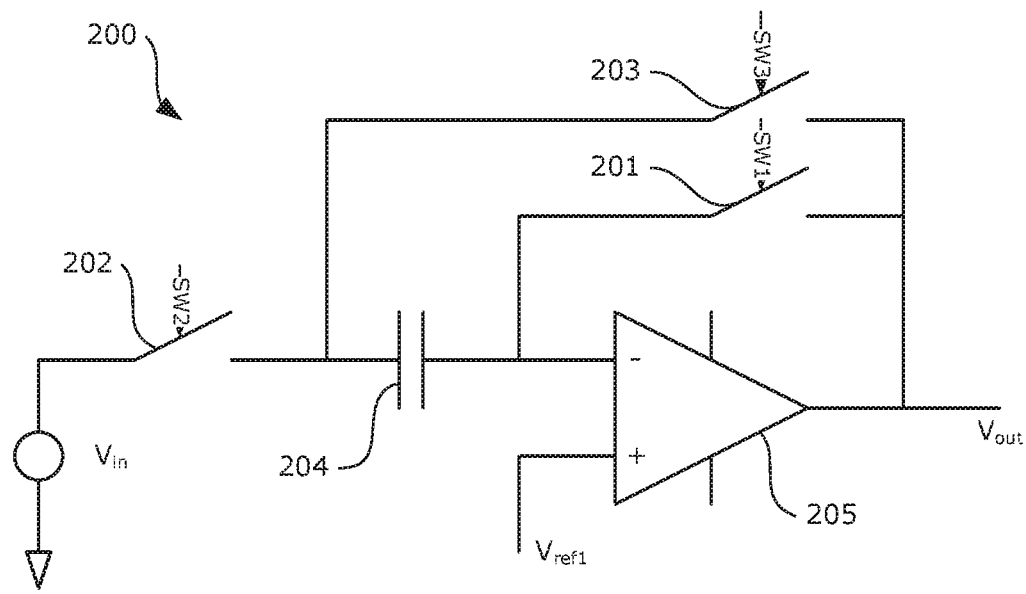
FIG. 2 illustrates an exemplary bottom plate sampling S/H circuit according to various aspects of the present disclosure.

FIG. 2 illustrates an exemplary analog S/H circuit 200, of a bottom plate sampling type. This illustrative S/H circuit comprises an amplifier 205, a sampling capacitor 204, and switches 201-203. In this example, $V_{ref1}$ is a reference voltage and $V_{in}$ is the input analog voltage (that is, the input signal) to be sampled. In an image sensor implementation, $V_{in}$ represents a pixel value. Switches 201-203 are preferably transistors, such as CMOS transistors.

Figure 3:
FIG. 3 illustrates an exemplary signal timing diagram of the exemplary S/H circuit according to FIG. 2.
Figure 3:
Figure 3:

In operation, switches 201-203 are controlled according to a particular timing by control signals SW1-SW3. That is, switch 201 is controlled by a control signal SW1, switch 202 is controlled by a control signal SW2, and switch 203 is controlled by a control signal SW3. FIG. 3 illustrates an exemplary timing diagram for the operation of S/H circuit 200, and shows the respective waveforms of control signals SW1-SW3. In FIG. 3, for purposes of illustration, "high" signals indicate "closed" (i.e., connected) switches and "low" signals indicate "open" (i.e., disconnected) switches.

At the beginning of the illustrated period, the signal $V_{in}$ is sampled. During this period, signals SW1 and SW2 are high and signal SW3 is low. Thus, switches 201 and 202 are closed, whereas switch 203 is open. This causes capacitor 204 to be charged to the voltage $V_{in}(t1)-V_{ref1}$, where t1 is the time where the capacitor is charged. After capacitor 204 has been charged, signal SW1 becomes low, while signal SW2 remains high and signal SW3 remains low. Thus, switch 201 is opened, while switch 202 remains closed and switch 203 remains open. This disconnects the feedback path of amplifier 205. The voltage at capacitor 204 remains at the level of the previous stage, i.e. $V_{in}(t1)-V_{ref1}$. Then, signals SW2 and SW3 are reversed. That is, while switch 201 remains open, switch 202 becomes open and switch 203 becomes closed. The voltage $V_c$ on capacitor 204 and the feedback connection on amplifier 205 cause the output voltage $V_{out}$ of amplifier 205 to be the same as $V_{in}$. That is, $V_{out}=V_c+V_{ref1}=V_{in}(t1)-V_{ref1}+V_{ref1}=V_{in}(t1)$.

Figure 4:
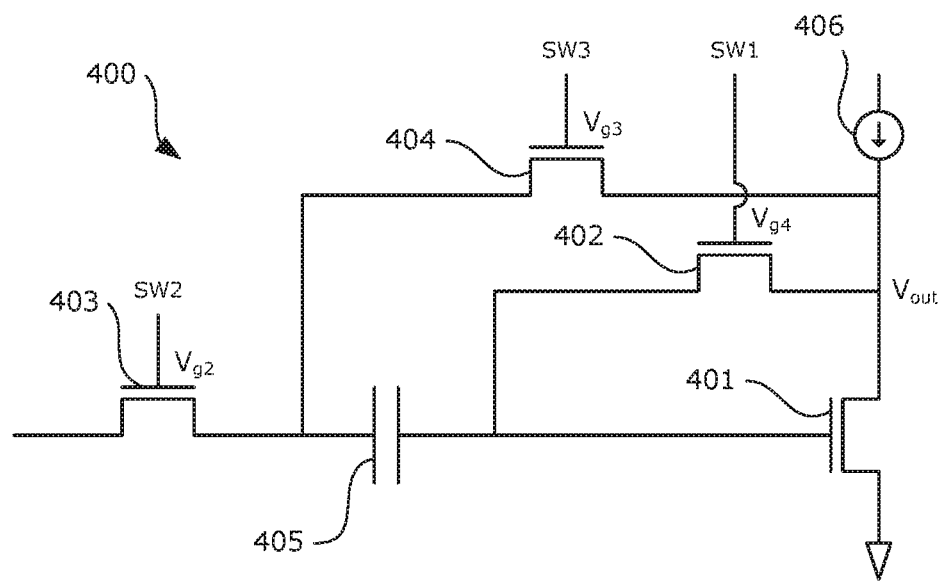
FIG. 4 illustrates an exemplary implementation of a sample-and-hold circuit using transistors according to various aspects of the present disclosure.

FIG. 4 illustrates an implementation of S/H circuit 200 using transistors. In FIG. 4, S/H circuit 400 includes an amplifier and switches, each of which are implemented using NMOS transistors. Thus, S/H circuit 400 includes NMOS transistors 401-404, a sampling capacitor 405, and a current source 406. Transistors 402-404 are controlled via their gate voltages. Using transistor 402 as an example, when the gate voltage $V_{g2}$ slightly exceeds the transistor threshold voltage $V_{th2}$, transistor 402 conducts current and behaves like a resistor. In other words, transistor 402 operates in the "linear" or "ohmic" region. Similarly, transistors 403 and 404 are turned on and off by applying suitable gate voltages $V_{g3}$ and $V_{g4}$, respectively.

The timing and operation of S/H circuit 400 follows a similar switching sequence as described earlier with regard to S/H circuit 200. That is, signal SW1 is applied to the gate electrode of transistor 402, signal SW2 is applied to the gate electrode of transistor 403, and signal SW3 is applied to the gate electrode of transistor 404.

Figure 5:
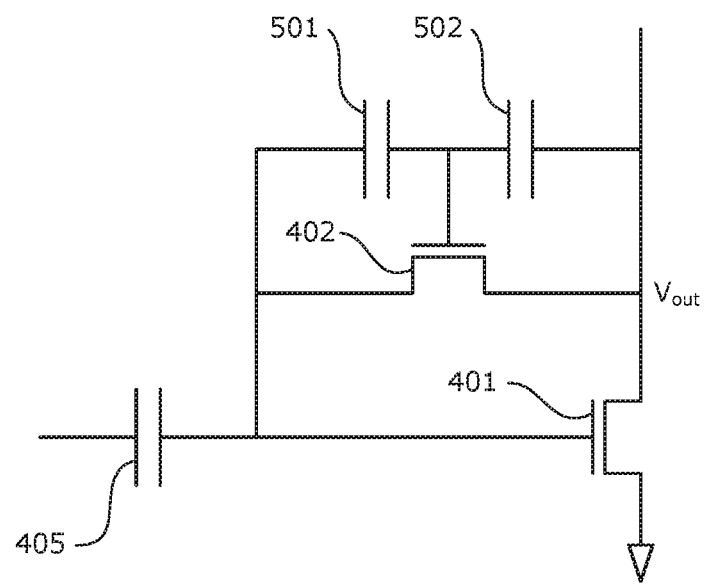
FIG. 5 illustrates stray capacitances in a transistor switch in an implementation according to FIG. 4.

At the beginning of the sampling period, transistors 402 and 403 are turned on, whereas transistor 404 is turned off. In this step, sampling capacitor 405 is charged. Because transistor 402 is in the on state (i.e., conducting current), the gate bias voltage causes a small quantity of charge to reside in the channel of transistor 402. Subsequently, when transistor 402 is turned off, the charge in transistor 402 flows to the output node $V_{out}$ and sampling capacitor 405 via the stray capacitances 501 (between the gate and the source of transistor 402) and 502 (between the gate and the drain of transistor 402), as illustrated in FIG. 5. This is referred to as the "stray charge." The stray charge flowing to capacitor 405 changes its voltage by a small amount. That is, the gate voltage of transistor 401 becomes $V_{g1}+\Delta$ where $\Delta$ is a small voltage variation that is dependent on a number of factors. $\Delta$ is represented as a function of these factors $f(V_{th1}, V_H-V_L, \text{slope}(V_{g2}))$. In the above relations, $V_{g1}$ is the gate voltage if there exist no stray capacitances or stray charges, $V_{th1}$ is the threshold voltage for output transistor 401 to begin conducting, $V_H$ is the high voltage at the gate of transistor 402, $V_L$ is the low voltage at the gate of transistor 402, slope($V_{g2}$) is the rate of change of the gate voltage in transistor 402, and f indicates that there is some form of functional dependence on the arguments.

Even though $\Delta$ may be small, it still causes inaccuracies in the output of S/H circuit 400. This is undesirable in applications where a high precision of the S/H circuit is required. Moreover, in S/H circuit implementations using a feed forward method for KTC noise cancellation, even a small variation in $V_{g1}$ may cause a large change in the output and a result clipping may occur in the output.

Figure 6:
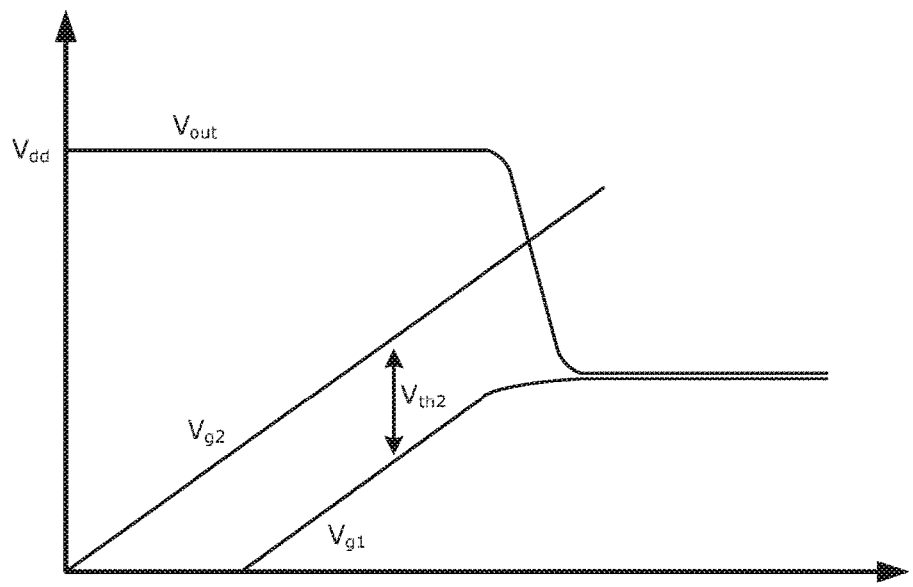
FIG. 6 illustrates an exemplary relationship among transistor gate voltages and an output voltage in an implementation according to FIG. 4.

FIG. 6 illustrates the relationship among gate voltages $V_{g1}$ and $V_{g2}$ of transistors 401 and 402, respectively, and the output voltage $V_{out}$ at the drain electrode of transistor 401 for S/H circuit 400 as illustrated in FIG. 4. Specifically, FIG. 6 illustrates the corresponding changes in $V_{g1}$ and $V_{out}$ as $V_{g2}$ is gradually increased from 0. Thus, for illustration purposes, the horizontal axis of FIG. 6 may be viewed as a time axis in the following non-limiting example, provided for purposes of illustration.

The initial conditions of this example are such that $V_{g2}$ of transistor 402 in S/H circuit 400 is 0 V. In this case, both transistors 401 and 402 are in a non-conducting state, and as a result $V_{out}$ is equivalent to the power supply voltage $V_{dd}$. As $V_{g2}$ is gradually increased as illustrated in FIG. 6, it will at some point exceed threshold voltage V. At this point, transistor 402 beings conducting current. Because of the circuit arrangement of S/H circuit 400, gate voltage $V_{g1}$ of transistor 401 begins to follow $V_{g2}$, but stays at a level $V_{th2}$ below $V_{g1}$ (i.e., $V_{g2}=V_{g1}+V_{th2}$). During this period, transistor 401 is still not conducting because $V_{g1}$ is below $V_{th1}$. Once $V_{g2}$ exceeds $V_{th1}+V_{th2}$, the gate voltage $V_{g1}$ rises above $V_{th1}$ and transistor 401 also begins to conduct current. As a result, $V_{out}$ drops from $V_{dd}$. The relationship $V_{g2}=V_{g1}+V_{th2}$ holds until transistor 401 enters the saturation region, at which point $V_{g1}$ starts to flatten out as illustrated in FIG. 6. As $V_{g2}$ continues to increase, at some point $V_{g1}$ will reach $V_{th1}+V_{sat1}$, where $V_{sat1}$ is the saturation voltage of transistor 401. At this point, transistor 401 is operating in the saturation region and $V_{out}$ is maintained at a level equal to $V_{th1}+V_{sat1}$.

For S/H circuit 400, the minimum gate voltage $V_{g2min}$ of transistor 402 that is required for transistor 401 to conduct in the saturation region defined by the relationship $V_{g2min}=V_{sat1}+V_{th2}$. For purposes of controlling S/H circuit 400 so that it functions properly, it is possible to swing the gate voltage $V_{g2}$ of transistor 402 between 0 and a pre-selected "high" level larger than this minimum voltage $V_{g2min}$. However, if the high level for $V_{g2}$ is significantly larger than $V_{g2min}$, the charge injection noise may increase because a higher voltage at the gate of a transistor generally results in more charges being accumulated in the conduction channel thereof. Therefore, it is preferable to swing voltage $V_{g2}$ between 0 and a level only slightly higher than $V_{g2min}$ for the purposes of turning on and off transistor 402. It is preferable to use a level higher than $V_{g2min}$, rather than $V_{g2min}$ itself, to account for component variations, circuit noise, and the like. Thus, the high level is preferably $V_{g2min}+V_{small}$. Preferred values of $V_{small}$ will be discussed in more detail below.

While S/H circuit 400 is described using an example where transistors 401-404 are NMOS transistors, S/H circuit 400 can alternatively be implemented using PMOS transistors. In other words, transistors 401-404 may all be PMOS transistors. In such a case, the polarities of the voltages in the circuit will be reversed, and the direction of the current source 406 will also be reversed to maintain the operation of S/H circuit 400. Similarly, in such a case the polarities of the voltages in the graphs of FIG. 6 will also be reversed.

Figure 7:
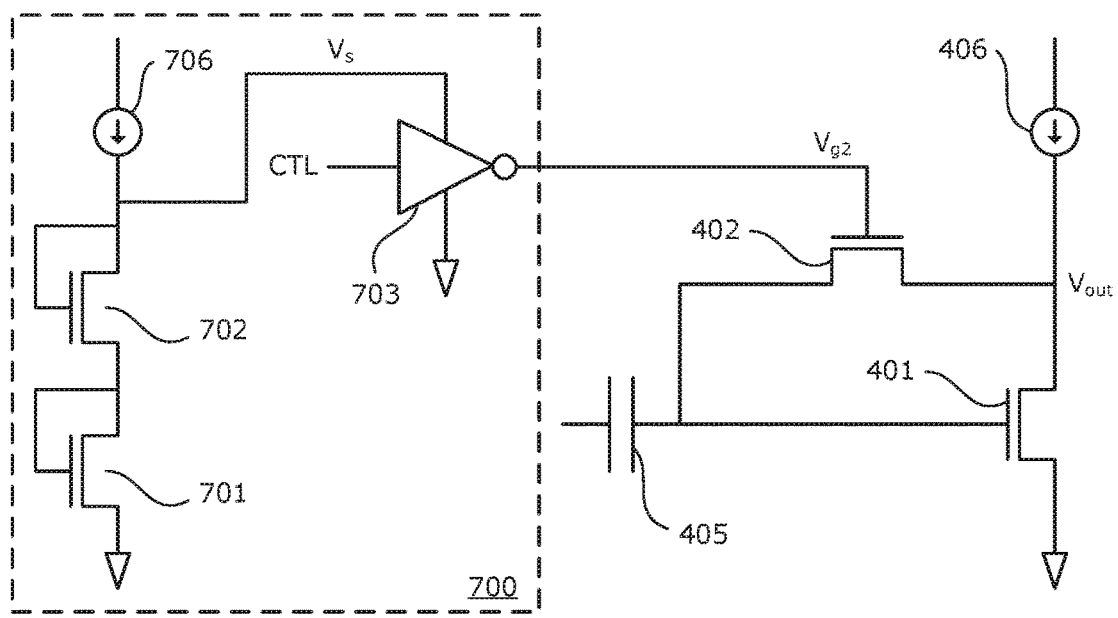
FIG. 7 illustrates an exemplary sample-and-hold circuit with an external circuit for providing a gate control signal according to various aspects of the present disclosure.

In order to properly control the operation of S/H circuit 400, then, a gate control circuit 700 is preferably used as illustrated in FIG. 7. For purposes of clarity in the illustration of FIG. 7, transistors 403 and 404 are omitted from this particular illustration. Gate control circuit 700 is utilized so that the necessary voltage for $V_{g2}$ may be provided, thus ensuring that S/H circuit 400 functions correctly and at the same time has a low injection noise level. Gate control circuit 700 includes transistors 701 and 702 connected in series, an inverter 703, and a current source 706. Inverter 703 uses a supply voltage $V_s$, and the output of inverter 703 is determined by the input control signal CTL, which is a 2-level (i.e., 1-bit) control signal. The exact high and low levels of CTL are subject only to the requirements that the high level is sufficiently high to cause the output of inverter 703 to be a low state, and the low level is sufficiently low to cause the output of inverter 703 to be a high state (i.e., supply voltage $V_s$). The output of inverter 703 is supplied as $V_{g2}$ to the gate of transistor 402.

Transistors 701 and 702 and current source 706 are matched to the circuit components of S/H circuit 400. That is, transistors 401 and 701 are matched so that they have the same characteristics; transistors 402 and 702 are matched so that they have the same characteristics, and current sources 406 and 706 are matched so that they supply the same current I. Since transistors 401 and 402 are NMOS transistors, it implies that transistors 701 and 702 should also be NMOS transistors. Transistors 401 and 402 are provided in a shorted state with the respective drains and gates thereof shorted. This ensures that both transistors 401 and 402 are in the on state. In this manner, $V_s$ is given by the relation $V_s=V_{th2a}+V_{sat1a}+V_{th1a}+V_{sat1a}$, where $V_{th1a}$ and $V_{th2a}$ are the threshold voltages of transistors 701 and 702, respectively, and $V_{sat1a}$ and $V_{sat1a}$ are the saturation voltages of transistors 701 and 702, respectively. Because the transistors in gate control circuit 700 are matched to their counterparts in S/H circuit 400, the above relation is equivalent to $V_s=V_{th2}+V_{sat2}+V_{th1}+V_{sat1}=V_{g2min}+V_{sat2}$.

When $V_s$ is used in this manner via inverter 703 to control transistor 402, the switching of transistor 402 is accomplished by applying a high or low level signal as CTL. Thus, from gate control circuit 700, the desired level $V_{g2min}$ plus a small voltage ($V_{small}$ as above) is applied to the gate of transistor 402. In the preferred embodiment described above, this small voltage equals the saturation voltage $V_{sat2}$ of transistor 402. Thus, by using gate control circuit 700 with matched circuit components, the appropriate voltage is provided to switch transistor 402 on and off so that S/H circuit 400 functions correctly and with a lower charge injection noise.

As noted above, the S/H circuit 400 of FIG. 4 may alternatively be implemented using PMOS transistors. In this case, gate control circuit 700 of FIG. 7 can likewise be implemented using PMOS transistors. In such an embodiment, all the transistors are PMOS transistors, including transistors 701 and 702. Furthermore, the polarities of the voltages should be reversed, the direction of the current sources 406 and 706 should be reversed, and the polarity of the CTL signal should be reversed.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An image sensor, comprising:
a pixel circuit configured to generate a pixel signal;
a vertical signal line configured to convey the pixel signal;
a sample-and-hold circuit configured to receive the pixel signal, the sample-and-hold circuit, including:
 a first transistor,
 a second transistor disposed between a gate and a drain of the first transistor,
 a sampling capacitor, an electrode of the sampling capacitor being connected to the gate of the first transistor, and
 a first current source connected to the drain of the first transistor; and
a gate control circuit configured to provide a gate control signal to a gate of the second transistor,
wherein the gate control circuit includes an inverter configured to receive a supply voltage and an inverter control signal, and output the gate control signal.

2. The image sensor according to claim 1, wherein a minimum voltage of the gate control signal is $V_{th2}+V_{sat2}\pm V_{th1}+V_{sat1}$, wherein $V_{th1}$ is a threshold voltage of the first transistor, $V_{sat1}$ is a saturation voltage of the first transistor, $V_{th2}$ is a threshold voltage of the second transistor, and $V_{sat2}$ is a saturation voltage of the second transistor.

3. The image sensor according to claim 1, wherein the gate control circuit comprises a third transistor, a fourth transistor connected to the third transistor in series, and a second current source.

4. The image sensor according to claim 3, wherein the third transistor, the fourth transistor, and the second current source provide the supply voltage to the inverter.

5. The image sensor according to claim 3, wherein
the first transistor and the third transistor are matched so as to have the same transistor characteristics as one another,
the second transistor and the fourth transistor are matched so as to have the same transistor characteristics as one another, and
the first current source and the second current source are configured to output the same current as one another.

6. The image sensor according to claim 3, wherein a gate and a drain of the third transistor are connected to one another, and a gate and a drain of the fourth transistor are connected to one another.

7. The image sensor according to claim 3, wherein the third transistor and the fourth transistor are NMOS transistors.

8. The image sensor according to claim 3, wherein the third transistor and the fourth transistor are PMOS transistors.

9. The image sensor according to claim 1, wherein
in a case where the inverter control signal is at a higher level of two voltage levels, the inverter is configured to output a first state voltage, and
in a case where the inverter control signal is at a lower level of the two voltage levels, the inverter is configured to output a second state voltage.

10. The image sensor according to claim 9, wherein the second state voltage is the supply voltage, and the first state voltage is lower than the supply voltage.

11. The image sensor according to claim 1, wherein the first transistor and the second transistor are NMOS transistors.

12. The image sensor according to claim 1, wherein the first transistor and the second transistor are PMOS transistors.

13. The image sensor according to claim 1, wherein the pixel circuit comprises a photoelectric conversion device, a floating diffusion, a transfer transistor, a reset transistor, and an amplification transistor.

14. The image sensor according to claim 13, wherein the pixel circuit comprises a selection transistor.

* * * * *